LINEAR FREQUENCY SWEPT OSCILLATOR

Filed March 11, 1968 3 Sheets-Sheet 1

INVENTORS
HANSEL B. MEAD
SCOTT V. CAMPBELL

LINEAR FREQUENCY SWEPT OSCILLATOR

Filed March 11, 1968 3 Sheets-Sheet 3

United States Patent Office 3,493,883

Patented Feb. 3, 1970

3,493,883

LINEAR FREQUENCY SWEPT OSCILLATOR

Hansel B. Mead and Scott V. Campbell, Melbourne, Fla., assignors to Television Audit Corporation, Melbourne, Fla., a corporation of Florida Filed Mar. 11, 1968, Ser. No. 712,285
Int. Cl. H03b 3/04
U.S. Cl. 331—4 14 Claims

ABSTRACT OF THE DISCLOSURE

Disclosed is an oscillator having an output frequency which varies linearly with time. A portion of the oscillator output is fed to a discriminator and through a capacitor connected in an integrating feedback loop so that the linearity of the oscillator output is determined almost completely by the linearity of the discriminator response. Retrace is quite rapid and the oscillator can be synchronized with an external clock.

This invention relates to an oscillator circuit and more particularly to a system for sweeping the output of an oscillator through a range of frequencies at a linear rate. The system of the present invention is particularly suited as a sweep oscillator for receivers used in monitoring local oscillator signals from radio and particularly television sets.

In assignee's U.S. Patent No. 3,299,355 there is disclosed a system and method for monitoring radio and TV receivers by detecting transmitted local oscillator signals. The system of that patent is particularly designed for use in an aircraft but may also be used on a tower in conjunction with a rotating antenna at the receiver which rotates or otherwise sweeps over the area to be monitored. The patented system is primarily designed to receive signals radiated from the local oscillators of television receiving sets by way of a remote monitor and antenna. A somewhat similar but modified receiver system particularly designed for noise-free reception from towers and the like is disclosed in assignee's copending application Ser. No. 608,589, filed Jan. 11, 1967.

In those systems, the incoming signals from the local oscillators of radio and particularly television sets, are combined in the receiver with a monitor receiver oscillator signal that is swept through a predetermined band of frequencies. The present invention provides an improved swept oscillator particularly designed for receivers of the type described in the above-mentioned patent and application and particularly one having a much more stable or linear change in output frequency as a function of time.

The standard approach in constructing a linear frequency scan versus time is to provide a linear ramp generator (saw-tooth) driving a voltage controlled oscillator (VCO). However, it has been found that it is quite difficult to construct a linear VCO having the band span required for systems of this type, i.e., two to four megahertz, and more specifically, about 3.5 megahertz. It is also difficult to construct a good ramp generator at the slow rate required for systems of this type, i.e., having a sweep rate of about one sweep per second. For example, the common method of using a reactance diode to tune an oscillator gives a tuning curve ($f=KV^{1/4}$) which, for large deviations, is non-linear.

The present invention is based on the fact that it has been found possible to build a linear discriminator having good linearity over a frequency range of from 3–4 mHz. and particularly the 3.5 mHz. range required for detecting local oscillator signals from television receiving sets. The discriminator can be constructed from conventional integrated circuits and is center tuned at the system local oscillator frequency such at 101.5 mHz. Some of the oscillator output is sampled and fed back through the discriminator and a discriminator watching amplifier and on through an integrating circuit which closes an integrating loop. The amplifier driving the voltage controlled oscillator has a high DC gain, thereby causing the linearity of the ramp generated by the system to be controlled substantially entirely by the discriminator linearity.

A level detector senses the discriminator ramp and when it trips, causes retrace of the sweep. Finally, provision is also incorporated in the oscillator of this invention for producing an output signal as the oscillator passes through its center frequency by means of which the oscillator sweep may be automatically adjusted and synchronized with the main system clock of the receiver.

It is therefore one object of the present invention to provide an improved variable frequency oscillator.

Another object of the present invention is to provide a sweep frequency oscillator having improved linearity.

Another object of the present invention is to provide a system for controlling the output of an oscillator so that its frequency varies linearly with time, i.e., $\Delta F/\Delta T$ is a constant.

Another object of the present invention is to provide a linear frequency swept oscillator having increased band width at a relatively slow sweep rate.

Another object of the present invention is to provide a system for controlling the output frequency of a variable frequency oscillator by means of a discriminator and capacitive feedback network such that the linearity and frequency variation at the output of the oscillator is substantially that of the linear discriminator.

These and further objects and advantages of the invention will be more apparent upon reference to the following specification, claims and appended drawings wherein:

Figures 1, 2, 3A, 3B, 3C, 4:
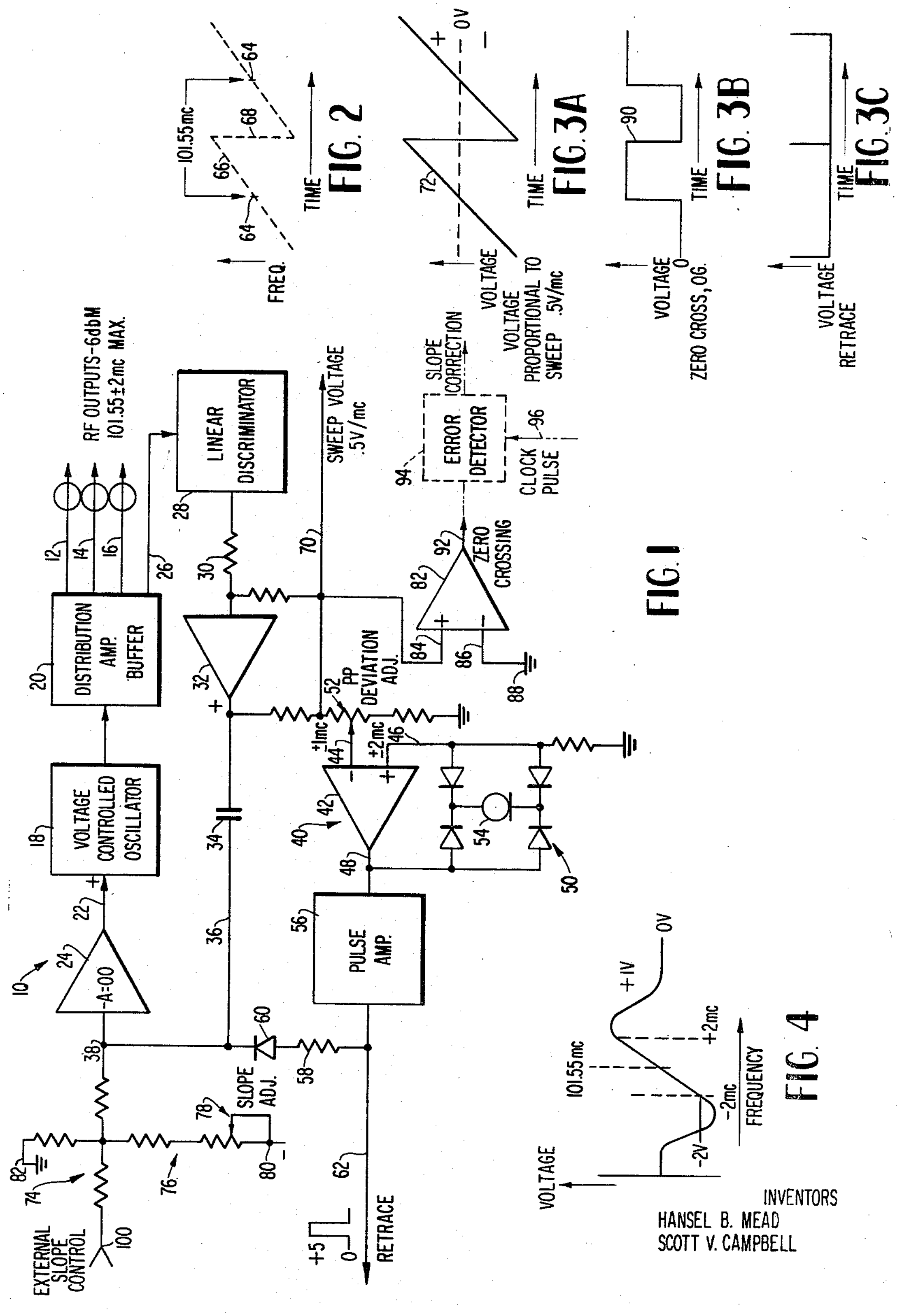
FIGURE 1 is a simplified block diagram of the linear frequency swept oscillator of the present invention.
FIGURE 2 is a plot of output frequency versus time for the circuit of FIGURE 1.
Figure 5A:
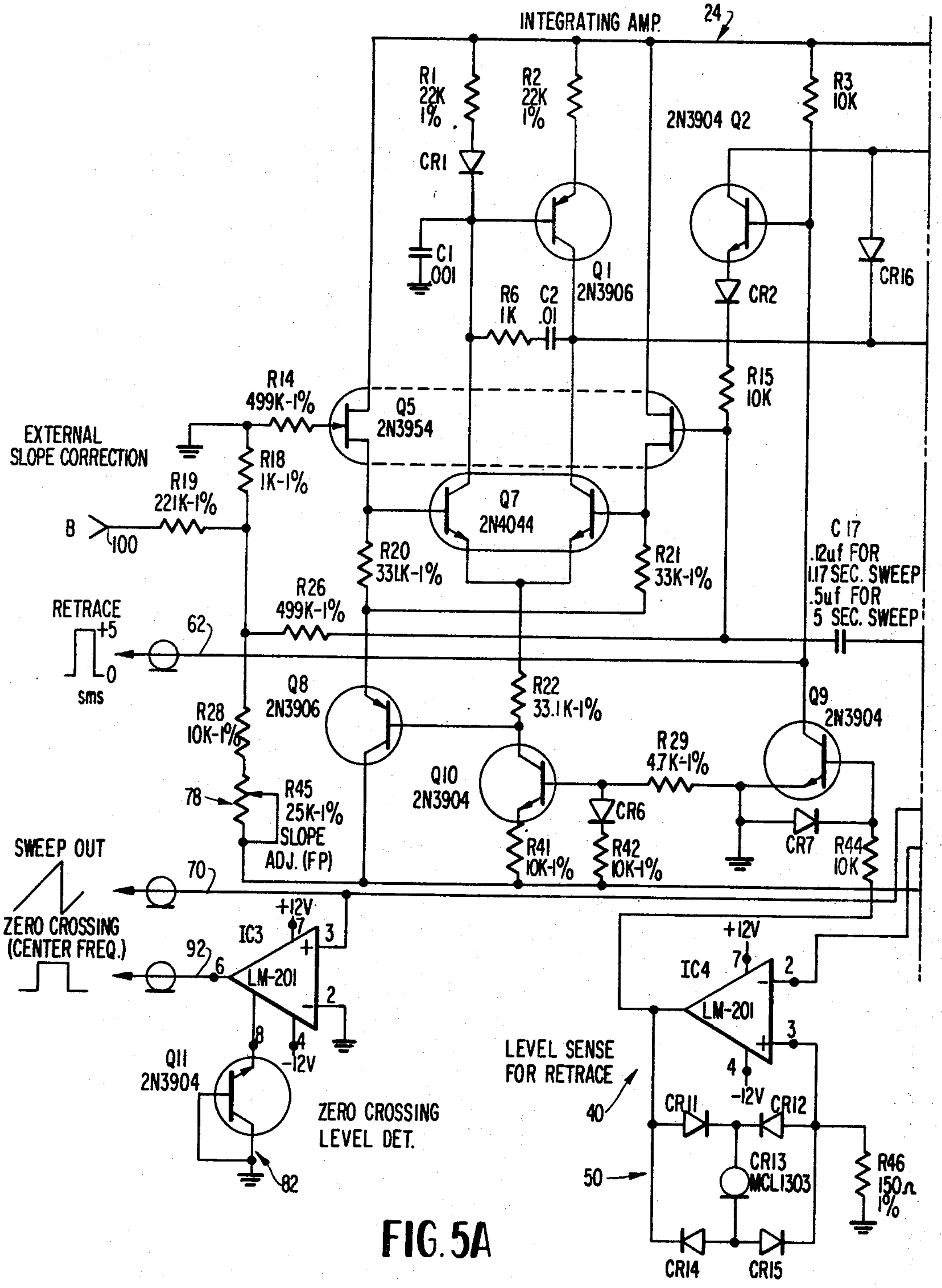
Figure 5B:
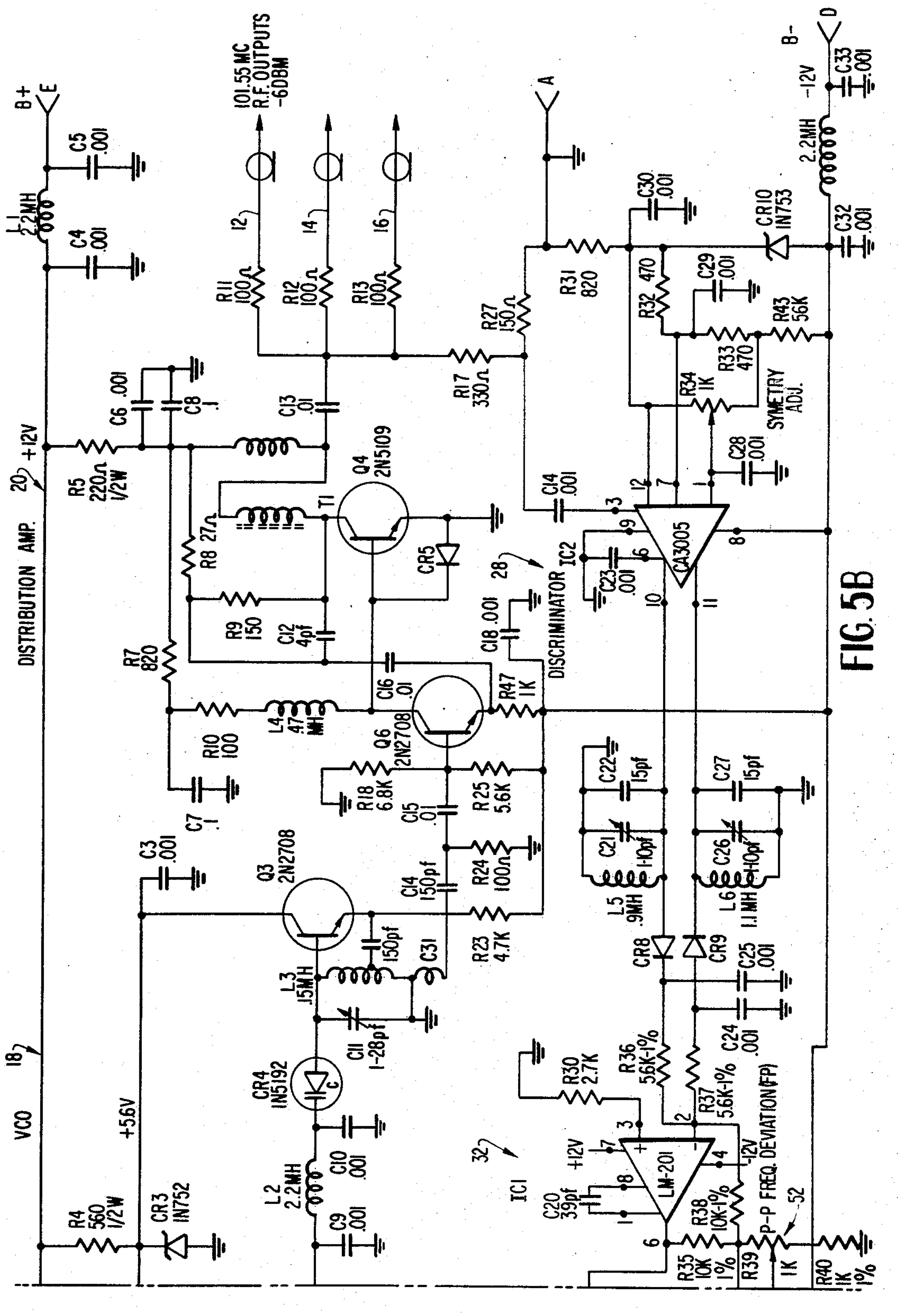

FIGURES 3A, 3B, and 3C are plots of voltages as a function of time at various points in the circuit of FIGURE 1 labeled A, B, and C respectively;

FIGURE 4 is a plot of the response curve for the linear discriminator of FIGURE 1; and FIGURE 5 is a detailed circuit diagram of the linear frequency swept oscillator of FIGURE 1.

Referring to the drawings, and particularly to FIGURE 1, the oscillator of the present invention, generally indicated at 10, is adapted to produce at three output terminals 12, 14, and 16, a variable frequency output having a center frequency of 101.55 mHz. and variable over a frequency band of approximately 2 to 4 mHz. That is, the sweep width of the output of oscillator 10 is adjustable from ±1 to ±2 mHz. so as to readily cover the nominal 3.5 mHz. band within which almost all local oscillators tuned to the same television station normally operate.

Oscillator system 10 includes a conventional voltage controlled oscillator 18 incorporating a reactance diode (Varicap) which varies the output frequency of the oscillator over the range specified above. The signal from voltage controlled oscillator 18 passes to the output leads 12, 14, and 16 by way of a distribution or RF buffer amplifier 20. A control voltage is fed to the reactance diode of voltage controlled oscillator 18 by way of lead 22 from a direct coupled driver amplifier 24 having a high negative gain ideally approaching infinity.

A portion of the output from distribution amplifier 20 is fed by way of lead 26 to the input of a linear discriminator 28 having the response curve illustrated in FIGURE 4. That is, the response curve of discriminator 28 is linear from −1 volt to +1 volt over a frequency range of from 99.55 mHz. to 103.55 mHz. with the response curve centered at a frequency of 101.55 mHz. The output of the discriminator 28 is coupled through a resistor 30 to a discriminator watching amplifier 32 which reverses the polarity of the discriminator output and which, in turn, has its output connected to one plate of integrating capacitor 34. The other plate of capacitor 34 is connected by way of lead 36 to the input terminal 38 of driver amplifier 24. This amplifier along with voltage controlled oscillator 18, distribution amplifier 20, linear discriminator 28, watching amplifier 32, and integrating capacitor 34 can be considered as a unit to operate much in the manner of an integrating amplifier and particularly because of the high DC gain of direct coupled amplifier 24 in the integrating loop, the linearity of the ramp to be controlled is substantially entirely determined by the linearity of the discriminator 28.

Also connected to the output of watching amplifier 32 is a level detector generally indicated at 40, which comprises a level sensing operational amplifier 42 having a pair of input arms, i.e., negative arm 44 and positive arm 46, and its output 48 conected through a positive feedback network 50 to positive arm 46. Negative arm 44 of level sensing amplifier 42 is connected to the output of amplifier 32 through an adjustable potentiometer 52. Feedback network 50 comprises a semi-conductor diode bridge in combination with a constant current diode 54. Level sensing amplifier 42 generates a retrace pulse which is passed through pulse amplifier 56 and supplied to the input of driving amplifier 24 by way of resistor 58 and rectifier diode 60. The retrace pulse may also be supplied to other circuits in the receiver by way of an output lead 62.

Referring to FIGURE 2, a plot of frequency at the output terminals 12, 14, and 16 of the oscillator system as a function of time takes the saw tooth configuration illustrated in that figure. The positive ramp is centered about a frequency of 101.55 mHz. as indicated at 64. The ramp is very linear, i.e., has a constant slope as illustrated at 66 and rapidly retraces, as indicated by the abrupt vertical drop in frequency at 68.

FIGURES 3A, 3B, and 3C are plots of voltage as a function of time at various points in the circuit of FIGURE 1 labeled A, B, and C respectively. A sweep voltage as illustrated in FIGURE 3 having a saw-tooth wave form, is generated at the output of linear discriminator 28 and this may be supplied to other portions of the receiver circuit by way of output lead 70. This voltage changes at a rate of 0.5 volt per mHz. Again, due to the linearity o fthe discriminator 28, the sweep voltage has a linear ramp 72 of constant slope. FIGURE 3B shows the zero crossover output pulses on lead 62 described below. FIGURE 3C shows the output pulses on retrace lead 62 in relation to the zero cross over output illustrated in FIGURE 3B.

As previously mentioned, the system illustrated in FIGURE 1 functions to maintain $\Delta F/\Delta T$ constant. However, the slope or angle of the positive ramp illustrated in FIGURE 2 may be adjusted by varying the bias on driver amplifier 24. A resistive input network 74 is connected to the input of amplifier 24 for a purpose more fully described below and coupled to this input circuit is a bias circuit 76 including a variable potentiometer 78 connected between the negative side of a DC power supply 80 and the other side of the power supply, or to ground as illustrated at 82. Movement of the wiper arm of potentiometer 78 varies the DC bias on amplifier 24 to change the slope of the positive ramp and thereby adjust the sweep frequency rate which nominally is in the neighborhood of one full sweep cycle per second.

Connected to the output of linear discriminator 28, is a second level sensing amplifier 82, having a positive input arm 84 and a negative input arm 86 connected to system ground 88. Amplifier 82 produces the output pulse 90 illustrated in FIGURE 3B on its output lead 92 when the positive going ramp passes through the center frequency of 101.55 mHz. That is, the voltage at output lead 92 goes positive when the potential on positive arm 84 passes through the ground potential level at which the other arm 86 is maintained.

The purpose of the zero crossing output pulse on lead 92 is to provide an arrangement for synchronizing the oscillator. One way of doing this is to connect output lead 92 to an error detector indicated by dashed lines at 94. The other input of the error detector receives a pulse by way of lead 96 from the system clock (not shown) which pulse represents the time at which the midpoint frequency should be reached by the oscillator. Any difference in time between the receipt of the pulse on output lead 92 and the clock pulse on lead 96 is sensed by the error detector which develops an analog output signal on its output lead 98 representative of this difference. Lead 98 is in turn coupled back to the input circuit 74 and specifically to input terminal 100 of oscillator system 10 to provide a slope correction input signal to driver amplifier 24.

FIGURE 5 is a detailed circuit diagram of those portions of the oscillator 10 illustrated in solid lines in FIGURE 5, like parts bearing like reference numerals. The oscillator system incorporates integrated circuitry and as illustrated in FIGURE 5, utilizes an RCA–3005 integrated circuit. As illustrated in the drawing, the portions of the circuit including discriminator 28, watching amplifier 32, level detector 82, and level sensor 40 are formed of integrated circuitry labeled IC–1 through IC–4. Various portions of the circuit in FIGURE 4 are divided by dashed lines generally indicating where the elements perform the different functions illustrated by the block diagram of FIGURE 1.

In operation and referring to FIGURE 1, starting at the beginning of the sweep, the driving amplifier 24 is biased slightly negative by way of adjustable potentiometer 78 from the power supply. This causes the voltage controlled oscillator 18 and discriminator amplifier output 32 driving the integrating capacitor 34 to go positive, creating the integrating action. The loop is heavily fed back through the capacitor in a negative sense so that it functions much as an operational integrator or integrating amplifier. As the capacitor 34 charges up, the level sense amplifier arm 44 is driven in a positive direction. During this time, amplifier 42 is saturated positive and the output on lead 48 is positive. By way of positive feedback through network 50, arm 46 of amplifier 42 is biased to approximately ½ volt positive under the control of constant current diode 54. The integrating action through capacitor 34 causes the positive going ramp to be highly linear.

Near the end of the sweep, the ramp out of the discriminator amplifier 32 advances to its level sense point, i.e., one-half volt positive. At this time, the potential on arm 44 goes above the potential on feedback arm 46 causing the level detector to change over and to produce a negative output at lead 48 (operational amplifier 42 is saturated negative). This causes, again through the feedback action of network 50, positive arm 46 to likewise go ½ volt negative. At the same time, the change in potential on output lead 48 causes a large positive bias on the input 38 to the driving amplifier 24, through resistor 58 and diode 60. Thus, the retrace ramp is much faster than the sweep ramp (approximately 1000:1). When the retrace ramp reaches −½ volt, the output of level sense amplifier 42 switches again to positive saturated (+) starting the positive ramp and another sweep. Potentiometer 52 at the sense point, allows a peak-to-peak frequency adjustment of the sweep without affecting the symmetry around the center frequency.

The second level sense amplifier 82 is used to sense when the frequency has crossed center band (called zero crossing). This may be used in conjunction with noise blocking and the system clock to synchronize the sweep oscillator via the external slope control input terminal 100. The zero crossing feature is used only for synchronization and does not form an essential feature of the oscillator system 10, i.e., it will operate satisfactorily without it. However, an important feature of the system is that it does provide an arrangement where the zero crossing pulse is available on lead 92 so that the frequency scan can be accurately synchronized with the system clock or with a blanking clock when the monitor receiver incorporates noise blanking.

One way of doing this is providing in the detector 94, a binary blanking counter. The blanking clock subdivides each frequency sweep into $2_7$ discrete intervals. The binary counter counts the clock pulses and a set of decoding gates provides blanking in intervals variable in position and width. This blanking system is used to inhibit interfering signals such as known FM stations and radio navigation aids that might be falsely counted as television receivers. It is desirable for each of these intervals to be stable with respect to the frequency being scanned. The more stable they are, the narrower the blanking pulses can be with the assurance that each will remain aligned with the interfering signal which it is to inhibit. If this system is not quite stable, the blanking pulses must be wide to allow for drift. With wide blanking pulses, adjacent TV set signals will also be inhibited.

The feedback sweep frequency generator 10 assures that the sweep is highly linear with respect to time. To synchronize the sweep with the blanking clock, the blanking counter is started at the beginning of this sweep. The slope of the sweep is corrected by a feedback loop so that, at the center of the sweep frequency, the blanking counter has received $2^6$ clock pulses.

The center frequency pulse comes from a zero crossing. A logic circuit in detector 94 monitors the output of this zero crossing and the $2^6$ pulse on lead 96 from the gate blanking counter. An error counter in detector 94 is started with either the center frequency pulse or the $2^6$ pulse, whichever comes first. The error counter is stopped with the other pulse. The number stored in the error counter is proportional to the magnitude of the error. The sign of the error is determined by which of the two signals comes first. If the sign is negative, the number is complemented. A digital-to-analog converter in detector 94 is attached to this error counter, converts the digital error signal to an analog voltage which is then applied to the external slope correction terminal 100 to correct the sweep rate. This feedback loop makes one correction per frequency sweep, holding the center frequency pulse coincident with the $2^2$ pulse from the blanking counter.

It is apparent from the above that the present invention provides an improved and very versatile sweep frequency generator or swept oscillator and one in which the linearity of the frequency change rate is substantially improved. Important features in addition to the improved linearity provided by the integrating feedback system includes a relatively wide frequency band width at a relatively low sweep rate, i.e., a band width of from 2–4 mHz. at a sweep rate in the neighborhood of approximately one full sweep per second. An additional important feature of the oscillator resides in the provision of both a retrace pulse and a center frequency pulse, these two pulses making it possible to automatically synchronize the sweep of the oscillator with an external circuit such as a rating system data clock, or a blanking clock programmer. The following specifications are readily available and easily ascertainable with the system of this invention:

Center frequency: 101.55 mHz.
Sweep width: ±1 to±2 mHz. adjustable
Sweep rate: 3 mHz./sec.±30% adjustable
Linearity: ±1% for ±2 mc. deviation
Rate stability: ±5% over temperature and aging
Center frequency stability: ±25 kHz. over temperature and aging Outputs/inputs Output sweep voltage: ± around ground at .5 v./mHz. of deviation
RF output: 3–50 ohms output with at —6 dbm.±1 dbm.
Retrace: output pulse during retrace normally +5 v. goes to ground during sweep retrace
Output at oscillator center frequency crossing +10 volts (—) frequency to 0 volts at (+) frequency
Inputs: +12 volts at 30 ma.; —12 volts at 30 ma.
Input external slope correction ±50% for ±10 volts of control-decrease rate for positive voltage.

The invention may be embodied in other specific forms without departing from the spirit or essential characteristics thereof. The present embodiment is therefore to be considered in all respects as illustrative and not restrictive.

What is claimed and desired to be secured by United States Letters Patent is:

1. A variable frequency oscillator comprising a voltage controlled oscillator, a frequency discriminator coupled to receive a portion of the output of said controlled oscillator, an integrating capacitor coupling the output of said discriminator to the control element of said voltage controlled oscillator, a direct coupled driver amplifier connected between said capacitor and said controlled oscillator, said amplifier, oscillator, discriminator and capacitor forming an integrating feedback loop, and a level sensor coupled between the output of said discriminator and said oscillator for supplying a retrace signal to said oscillator when the output of said discriminator exceeds a predetermined level.

2. Apparatus according to claim 1 wherein said level sensor comprises an amplifier having a pair of inputs, one of said inputs coupled to the output of said discriminator, and a positive feedback network between the output of said level sensor amplifier and the other of said inputs.

3. Apparatus according to claim 2 wherein said positive feedback network comprises a diode bridge.

4. Apparatus according to claim 1 wherein said driver amplifier has a high negative gain ideally approaching infinity.

5. A variable frequency oscillator comprising a voltage controlled oscillator, a driver coupled to said oscillator for feeding a control signal to the control element of said oscillator, a linear frequency discriminator coupled to the output of said oscillator, and a negative feedback integrating capacitor coupling the output of said discriminator to the input of said driver whereby said oscillator generates signals varying in frequency linearly with time.

6. Apparatus according to claim 3 including a first level sensor coupled to the output of said discriminator, said first level sensor supplying a retrace signal to said driver when said discriminator output exceeds a predetermined level.

7. Apparatus according to claim 4 including a second level sensor coupled to the output of said discriminator, said second level sensor producing an output signal when said oscillator passes through its center frequency.

8. Apparatus according to claim 7 wherein said second level sensor produces an output signal when the output of said discriminator passes through a predetermined reference potential.

9. Apparatus according to claim 5 including means coupled to said driver for applying a variable bias to said driver to vary the sweep frequency of said oscillator.

10. A linear frequency swept oscillator comprising a voltage controlled oscillator, a direct coupled driver amplifier having a high negative gain ideally approaching infinity coupled to the control element of said oscillator, a distribution amplifier coupled to said oscillator for producing a sweep frequency output, a linear frequency discriminator coupled to receive a portion of the output from said distribution amplifier, a watching amplifier coupled to the output of said discriminator, an integrating capacitor coupling the output of said watching amplifier to the input of said driver amplifier, a level sensing amplifier having an output and a pair of inputs, means coupling one of said inputs to the output of said watching amplifier, a positive feedback network coupling the output of said level sensing amplifier to the other of said inputs, and a pulse amplifier coupled between said level sensing amplifier output and the input of said driver amplifier.

11. Apparatus according to claim 8 including a first output terminal for developing a retrace signal coupled to the output of said pulse amplifier.

12. Apparatus according to claim 9 including a second output terminal for developing a center frequency signal coupled to the output of said discriminator.

13. Apparatus according to claim 10 including an error detector for comparing the time of occurrence of said center frequency signal with a clock signal, and means for feeding the output of said error detector to the input of said driver amplifier to synchronize said oscillator with a clock.

14. Apparatus according to claim 8 wherein said coupling means comprises a variable resistor for adjusting the peak-to-peak deviation of the oscillator output.

References Cited

UNITED STATES PATENTS 3,165,698 1/1965 Friend et al. -------- 331—4 X
3,260,958 7/1966 Kawai ---------------- 331—4

ROY LAKE, Primary Examiner

SIEGFRIED H. GRIMM, Assistant Examiner

U.S. Cl. X.R.

331—30, 33, 178

UNITED STATES PATENT OFFICE

CERTIFICATE OF CORRECTION

Patent No. 3,493,883 Dated February 3, 1970

Inventor(s) Hansel B. Mead et al.

It is certified that error appears in the above-identified patent and that said Letters Patent are hereby corrected as shown below:

In the heading to the printed specification, lines 4 and 5, cancel "assignors to Television Audit Corporation, Melbourne, Fla., a corporation of Florida" and insert -- assignors, by mesne assignments, to Teltronic Measurement Systems, Inc., New York, N. Y., a corporation of Delaware --. Column 3, line 53, "o fthe" should read -- of the --. Column 5, line 17, $2_7$ should read $2^7$ same column 5, line 55, $2^2$ should read $2^6$ Signed and sealed this 3rd day of November 1970.

(SEAL)
Attest:

EDWARD M.FLETCHER,JR.
Attesting Officer

WILLIAM E. SCHUYLER, JR.
Commissioner of Patents